United States Patent
Hung et al.

(10) Patent No.: US 12,014,798 B2
(45) Date of Patent: Jun. 18, 2024

(54) IN MEMORY DATA COMPUTATION AND ANALYSIS

(71) Applicant: MACRONIX INTERNATIONAL CO., LTD., Hsinchu (TW)

(72) Inventors: Chun-Hsiung Hung, Hsinchu (TW); Shuo-Nan Hung, Zhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 212 days.

(21) Appl. No.: 17/710,367

(22) Filed: Mar. 31, 2022

(65) Prior Publication Data
US 2023/0317122 A1 Oct. 5, 2023

(51) Int. Cl.
G11C 7/10 (2006.01)

(52) U.S. Cl.
CPC .......... *G11C 7/1057* (2013.01); *G11C 7/1069* (2013.01); *G11C 7/1084* (2013.01); *G11C 7/1096* (2013.01)

(58) Field of Classification Search
CPC ... G11C 7/1057; G11C 7/1069; G11C 7/1084; G11C 7/1096
USPC ................................................... 365/189.05
See application file for complete search history.

(56) References Cited

U.S. PATENT DOCUMENTS

| | | | |
|---|---|---|---|
| 8,599,613 B2 | 12/2013 | Abiko et al. | |
| 8,661,294 B2 | 2/2014 | Lee et al. | |
| 10,297,336 B2 | 5/2019 | Hong et al. | |
| 10,318,168 B2 | 6/2019 | Lea et al. | |
| 10,403,352 B2 | 9/2019 | Hush et al. | |
| 2014/0237263 A1* | 8/2014 | Suzuki | G06F 12/0246 713/193 |

(Continued)

FOREIGN PATENT DOCUMENTS

| | | |
|---|---|---|
| CN | 112334916 A | 2/2021 |
| JP | S62245376 A | 10/1987 |
| TW | 202143067 A | 11/2021 |

OTHER PUBLICATIONS

Hamdioui et al., "Applications of Computation-In-Memory Architectures based on Memristive Devices," IEEE Automation & Test in Europe Conference & Exhibition, Florence Italy, Mar. 2019, pp. 486-491.

(Continued)

*Primary Examiner* — Huan Hoang
(74) *Attorney, Agent, or Firm* — Andrew L. Dunlap; Haynes Beffel & Wolfeld LLP

(57) ABSTRACT

A compute in memory device comprises a memory array including a plurality of data lines for parallel access to memory array data, and an input/output interface. Data path circuits between the memory array and the input/output interface include a page buffer, each buffer cell of the page buffer including a plurality of storage elements. A plurality of computation circuits is provided connected to respective buffer cells. The computation circuits execute a function of data in the storage elements of the respective buffer cells and can be configured in parallel to generate a results data page including operation results for the plurality of buffer cells. A data analysis circuit is connected to the data path circuits to execute a function of the results data page to generate an analysis result. A register can be provided to store the analysis result accessible via the input/output interface.

28 Claims, 15 Drawing Sheets

(56) References Cited

U.S. PATENT DOCUMENTS

2018/0205396 A1    7/2018  Ikegawa et al.
2019/0340064 A1   11/2019  Sity et al.
2020/0019508 A1*   1/2020  Oh .................... G06F 12/0215
2020/0243154 A1    7/2020  Sity et al.

OTHER PUBLICATIONS

Jamshidi et al., MagCim: A Flexible and non-Volatile computing-in-memory processor for energy-efficient logic computation, IEEE Access, vol. 10, Mar. 16, 2022, pp. 33445 to 35459.
Reuben, "Rediscovering Majority Logic in the Post-CMOS Era: A Perspective from In-Memory Computing," J. Low Power Electron. Appl., Sep. 4, 2020, pp. 1-15.

* cited by examiner

| | | IO 7 | IO 6 | IO 5 | IO 4 | IO 3 | IO 2 | IO 1 | IO 0 |
|---|---|---|---|---|---|---|---|---|---|
| CIM CNTL FEATURE ADDR | P1 | RSV | AD1BN | | | | | | |
| | P2 | OP# | INTK | OP2 | | | OP1 | | |

FIG. 6

| | IO 7 | IO 6 | IO 5 | IO 4 | IO 3 | IO 2 | IO 1 | IO 0 |
|---|---|---|---|---|---|---|---|---|
| STATUS REG | M | N | O | P | Q | R | S | FAIL |

FIG. 7

| | | IO 7 | IO 6 | IO 5 | IO 4 | IO 3 | IO 2 | IO 1 | IO 0 |
|---|---|---|---|---|---|---|---|---|---|
| INTK FEATURE ADDR | P1 | P/F SEG 1 | P/F SEG 2 | P/F SEG 3 | P/F SEG 4 | P/F SEG 5 | P/F SEG 6 | P/F SEG 7 | P/F SEG 8 |

FIG. 8

IN MEMORY DATA COMPUTATION AND ANALYSIS

BACKGROUND

Field

Technology related to compute in memory (CIM) devices is presented, examples of which include high-density NAND flash memory having computation circuits coupled to a page buffer.

Description of Related Art

In some CIM devices, a logic operation is executed using circuits on the data path between a memory array and an input/output interface. CIM devices can comprise an integrated circuit including the memory array and input/output interface on a single chip, and in some embodiments an integrated circuit spanning more than one chip in a multi-chip package. This configuration can result in very short data paths for the logic operation, enabling very fast operations with low energy costs.

It is desirable to provide more capability, and improved efficiencies for CIM devices, and for other devices having similar data paths.

SUMMARY

An integrated circuit is described that comprises a memory array including a plurality of data lines for parallel access to memory array data. Also, the integrated circuit includes an input/output interface. Data path circuits are described between the memory array and the input/output interface. The data path circuits include a plurality of buffer cells connected to respective data lines of the memory array, each buffer cell including a plurality of storage elements, such as can be provided in a page buffer. A plurality of computation circuits are provided connected to respective buffer cells in the plurality of buffer cells. The computation circuits execute a function of data in the storage elements of the respective buffer cells and can be configured in parallel to generate a results data page including operation results for the plurality of buffer cells. The results data page can be stored for example in storage elements of the plurality of buffer cells, or moved to a cache memory.

The function of data in the storage elements of the plurality of buffer cells executed by the plurality of computation circuits is a bit-by-bit logic operation on pages of data, or portions of pages, in two or more storage elements of each buffer cell of a page buffer in examples of the technology described herein.

A technology is described in which a data analysis circuit is connected to the data path circuits to execute a function of the results data page to generate an analysis result. A register can be provided to store the analysis result accessible via the input/output interface. In examples described herein, the data analysis circuit is connected to the plurality of buffer cells in the page buffer, or the data analysis circuit is connected to the cache memory. In some examples, more than one data analysis circuit can be included in the data path.

Technology is described in which the computation circuits include circuits to execute a group of functions, and are configurable in response to set-up data to select the function of data in the storage elements from the group of functions.

Also, technology is described in which computation circuits include circuits to execute a group of functions, and are configurable in response to set-up data to select more than one function to be executed in sequence on data in the storage elements.

In an example of the technology described herein, the function of the results data page executed in the analysis circuit includes counting of bits indicating a logic "1" or "0" in the results data page. Also, the data analysis circuit can include a circuit to perform a comparison of the resulting count to a criterion applied as a threshold.

In some embodiments, the results data page includes a plurality of segments, and the function of the results data page executed in the data analysis circuit includes a comparison of resulting counts for each segment to a criterion used as a threshold.

An integrated circuit is described including a controller and a command decoder, in which the controller is responsive to a command to set the logic operation of the computation circuits, and a command to adjust the analysis criterion, such as using register read and write operations to store setup data. Also, an integrated circuit is described including a controller and a command decoder, in which the controller is responsive to a command to set a parameter to enable or disable the analysis circuit for generation of analysis results in support of a CIM operation.

An integrated circuit is described including a controller and a command decoder, in which the controller is responsive to a command to store data from the input/output interface in selected storage elements of the plurality of buffer cells in preparation for execution of the CIM operations.

A method is described that is executed in an integrated circuit having a memory and page buffer. The method includes storing data in the page buffer as input to a computation; loading data from the memory array as input to the computation, and executing the computation in the page buffer to provide operation results. Also, a method can include applying an analysis criterion to the operation results to generate an analysis result, and to store the analysis result in an accessible memory, such as a control register. Also, a method can include transferring the operation results to a cache for data output. The method can include setting the operation type to select an operation for the computation in the page buffer, such as by writing an operation identifier to the control register. Also, the method can include setting an analysis criterion for the results of the computation.

A method is described that is executed in an integrated circuit having a memory and a page buffer that includes setting up a compute-in-memory operation that includes more than one logic operation in sequence performed on data stored in the buffer cells of the page buffer.

A method is described that is executed in an integrated circuit having a memory and a page buffer that includes providing computation circuits configured to execute more than one logic operation, and to select a logic operation to be used in response to set-up data, such as data in a control register. The control register can include set-up data indicating the type of logic operation, whether there is to be more than one operation executed in sequence, and the source of the input data for the logic operations.

In general, a technology is described for improving the efficiency and capability of CIM devices.

Other aspects and advantages of the technology presented can be seen on review of the drawings, the detailed description and the claims, which follow.

BRIEF DESCRIPTION OF THE DRAWINGS

FIG. 6 illustrates a control register usable to provide set-up parameters for a CIM operation according to some embodiments of the present technology.

FIG. 7 illustrates a control register usable to provide access to status information generated by data analysis circuits as described herein.

FIG. 8 illustrates a control register usable provide access to status information for segments of a page generated by data analysis circuits over segments of the page.

DETAILED DESCRIPTION

A detailed description of embodiments of the present technology is provided with reference to the FIGS. 1-14.

Figure 1:
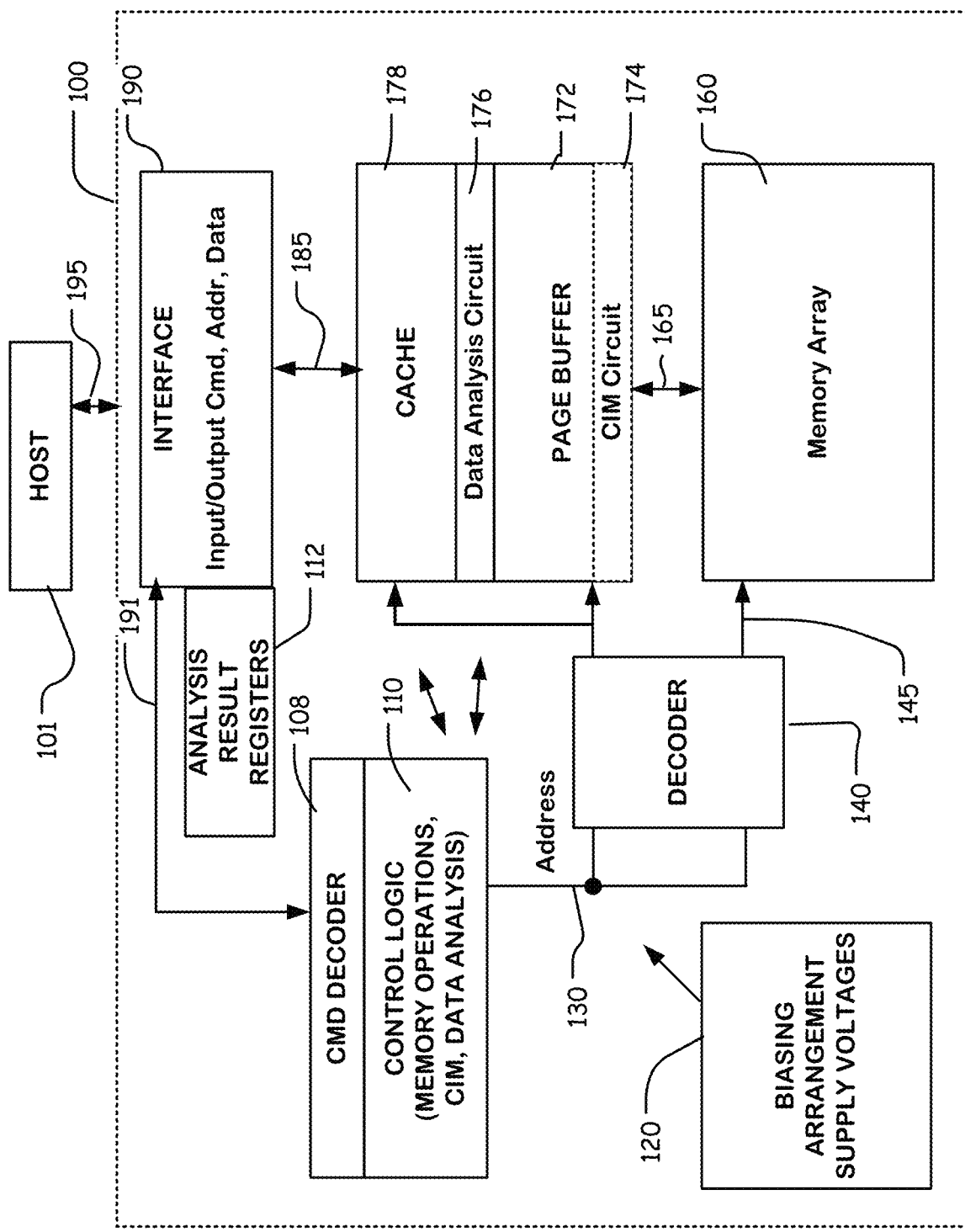
FIG. 1 is a simplified diagram of a CIM device including programmable CIM operations and including data analysis circuits as described herein.

FIG. 1 is a simplified chip block diagram of an integrated circuit memory device supporting programmable CIM operations and data analysis according to technology described herein. The integrated circuit memory device 100 includes a memory array 160, such as a NAND flash array, on a single integrated circuit substrate. Memory devices as described herein can be implemented using multichip modules, stacked chips and other configurations as well. Other types of memory arrays can be utilized as well, including NOR flash memory, phase change memory such as PCRAM, other programmable resistance memory RRAM such as transition metal oxide memory, ferroelectric random-access memory (FeRAM), magnetic random-access memory (MRAM), other types of nonvolatile memory, DRAM memory, SRAM memory and other types of volatile memory.

An I/O interface 190 is provided on the device for data transfer via input/output ports 195 (e.g. I/O pins) with a host 101. In some embodiments, the I/O ports 195 can connect to on-chip host circuits, such as a general purpose processor or special purpose application circuitry, or a combination of modules providing system-on-a-chip functionality supported by the memory array 160.

In one embodiment, the I/O interface 190 is a serial interface including a set of I/O ports 195 through which commands, addresses and data are communicated. The serial interface can be based on or compliant with a Serial Peripheral Interface (SPI) bus specification in which the command channel shares the I/O pins used by address and data. For example, the integrated circuit memory device 100 can include input/output ports using pins for receiving and transmitting SPI bus signals. One pin can be connected to an input data line carrying serial input data/address signal SI, usable for commands as well. Another pin, or multiple other pins, can be connected to an output data line or output data lines carrying a serial output data signal SO. Another pin can be connected to a clock line carrying serial clock signal SCLK. Yet another pin can be connected to a control line carrying chip-enable or chip-select signal CS #.

Other types of interfaces, including parallel interfaces and other types of serial interfaces can be used as well. The I/O ports 195 on a particular integrated circuit memory device 100 can be configured to provide output data with an I/O data width, which can be, for some examples, 1, 4, 8, 16, 32 or more bits in parallel per interface clock cycle.

Data path circuits between the I/O interface 190 and the memory array 160 include a page buffer 172, with a CIM circuit 174, a data analysis circuit 176, and the cache 178. The page buffer is coupled to the data lines 165 for parallel access to a page of memory data in the array 160. The cache 178 is coupled to the I/O interface 190 via a bus 185 typically supporting high speed transfer of storage units of data, such as bytes or words from the cache to the I/O interface 190. In some embodiments, storage elements in the page buffer 172 may be directly accessible to the I/O interface 190.

The memory device can include a set of control registers used to store status information, setup information and other parameters in support of memory operations, which can be accessible for read and write operations through the I/O interface 190, and through control logic 110 on the device. As illustrated in FIG. 1, the set of control registers can include analysis result registers 112, used to store output data and setup data for the data analysis circuit 176 and to store setup data for the CIM circuit 174.

Control logic 110 with a command decoder 108, on the integrated circuit memory device 100 includes logic, such as one or more state machines, responsive to received commands, such as on line 191 from the I/O interface 190, to execute memory operations, including read, program, erase, register read, register write and so on. The control logic 110 outputs and receives control signals, represented by arrows on the diagram, to the circuits on the device. Also the control logic provides addresses on bus 130. The addresses supplied on bus 130 can include for example outputs of an address counter (e.g., sequential addresses) in the control logic 110, or addresses carried in received commands. Also, the addresses can include cache addresses for access to the cache 178 and, as described herein, addresses for access to storage elements in the page buffer 172.

A address decoder 140 schematically in the block diagram is coupled to a plurality of word lines 145, along rows in the memory array, to the page buffer 172 and to the cache 178.

The page buffer 172 is coupled to a plurality of data lines 165 arranged along columns in the memory array 160 for page access to the array 160, including in operations to read data from and write data to the memory array 160.

The page buffer 172 can include a plurality of buffer cells coupled to respective data lines, for page access to the memory array 160. Each buffer cell can include a plurality of storage elements, such as storage elements supporting page read and page write of multiple bits per memory cell and supporting bit-by-bit CIM operations across pages and segments of pages, as described herein.

The address decoder 140 can select and couple specific memory cells in the array 160 via respective connecting data lines to the page buffer 172. The page buffer 172 can store data that is written to or read from these specific memory cells in parallel. The page buffer 172 can have a page width for pages including thousands of bits, such as 16K bits or 32K bits, or morel, with extra bits including associated metadata like ECC codes.

In the example shown in FIG. 1, control logic 110, using a bias arrangement state machine, controls the application of bias arrangement supply voltage generated or provided through the voltage supply or supplies in block 120, such as read, program and erase voltages including page write to transfer data from the page buffer to the memory array, and page read to transfer data from a page in the memory array to the page buffer.

The control logic 110 and command decoder 108 constitute a controller which can be implemented using special purpose logic circuitry including state machines and supporting logic. In alternative embodiments, the control logic comprises a general-purpose processor, which can be implemented on the same integrated circuit, which executes a computer program to control the operations of the device. In yet other embodiments, a combination of special-purpose logic circuitry and a general purpose processor can be utilized for implementation of the control logic.

The command decoder 108 and control logic 110 of the controller are configured to execute procedures responsive to input commands as described herein supporting the CIM operations and data analysis, as described in more detail below.

In the illustrated example, the host 101 is coupled to I/O ports 195 on the memory device 100, as well as other control terminals not shown, such as chip select terminals and so on, and can provide data, commands or instructions to the memory device 100. In some examples, the host 101 can comprise a general purpose processor, a special purpose processor, a processor configured as a memory controller, or other processor that uses the memory device 100. All or part of the host 101 can be implemented on the same integrated circuit as the memory. The host can execute computer programs which take advantage of the CIM capabilities and support data analysis executed on the memory device 100, to reduce power consumption and improve the speed of operations. The host 101 can issue sequences of commands to cause execution of these procedures, read the computation and analysis result, and select subsequent operations in response.

Figure 2:
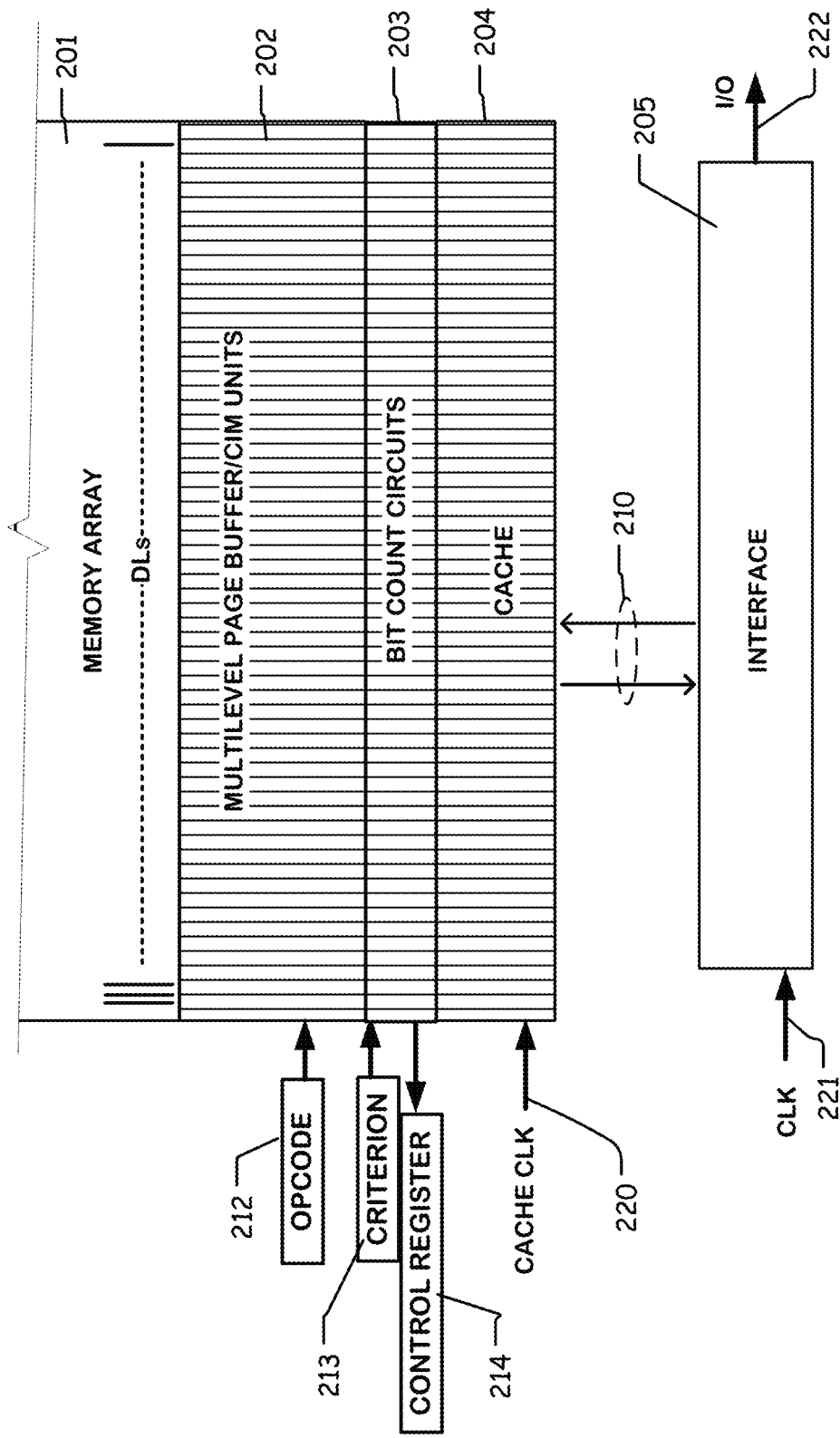
FIG. 2 is a simplified diagram of an example of data path circuits for a CIM device including embedded data analysis circuits.

FIG. 2 is a simplified diagram of the data path circuits between a memory array 201, such as the memory array 160 of FIG. 1, and an interface 205, such as the input/output (I/O) interface 190 of FIG. 1. The data path circuits include a multilevel page buffer 202, bit count circuits 203 and a cache 204. The multilevel page buffer 202 is divided as indicated by the vertical lines into a plurality of multilevel page buffer/CIM units. Each of the multilevel page buffer/CIM units can comprise a plurality of buffer cells. For example, a multilevel page buffer/CIM unit can comprise an array of 16 columns by 16 rows of buffer cells, coupled to 256 data lines of the memory array 201 in parallel.

Each of the buffer cells (see, e.g. FIG. 4) can comprise a plurality of storage elements and a logic unit that is configurable by an opcode 212, which can be stored in a control register or otherwise provided to set up the operation, to perform a selected logic function using data in the storage elements to generate an output and store the result. The result can be stored back into one of the storage elements in the plurality of storage elements of the buffer cell, or in some cases stored in other memory such as the cache 204. The combination of the results from the plurality of buffer cells provides a results data page including operation results for the plurality of buffer cells. In some embodiments, the results data page includes operations results for the logic operations in all of the page buffer/CIM cells in the page buffer for a whole page operation. In other embodiments, the results data page includes operation results for the logic operations in a segment of the page buffer/CIM cells for an operation over a portion (such as a segment as described below or another size portion) of a page.

The bit count circuits 203 or other data analysis circuits connected to the data path circuits perform analysis of the operation results (the results data page) of the logic operations in the page buffer. In this example, the analysis is a bit count of the number of "1" or "0" bits in the results data page, compares the count to a criterion 213 and outputs pass/fail results in a control register 214. The criterion 213 can be stored in a control register or otherwise provided to set up the analysis operation. The bit count circuits 203 in this example might be used in addition as a failed bit detector during a program or an erase operation for the memory array 201. In some embodiments, the bit count circuits 203 can be configured to perform additional logic operations over bits in the results data page, such as operations to compute a similarity or proximity score, and to compare the score to a criterion such as a threshold.

The pass/fail results in the control register 214 can be configured in different embodiments to include a parameter indicating whether the results data page as a whole passes the criterion, or in cases in which the results data page is divided into segments, to include parameters indicating which segments of the results data page pass the criterion, or to include both page-as-a-whole and by-segment analysis results.

The cache 204 is coupled to the multilevel page buffer 202 for high-speed transfer, for example, of data between selected storage elements in the buffer cells and the cache 204. The cache 204 can be configured as a plurality of cache units, with each cache unit corresponding to one of the multilevel page buffer/CIM units as indicated by the vertical partitions in the figure. In an example in which the multilevel page buffer/CIM unit which comprises an array of 16 columns by 16 rows of buffer cells, coupled to 256 data lines of the memory array 201 in parallel, each cache unit can likewise comprise an array of 16 columns by 16 rows of cache cells, with one cache cell corresponding to each buffer cell. Each column of the 16×16 cache unit can store a 16 bit word transferred from the corresponding 16 buffer cells. Data can be moved in parallel between cache cells and selected storage elements in corresponding buffer cells at a relatively high speed, at the rate of the cache clock 220 for example.

The cache 204 is coupled by a bus 210 for read and write transfers with the interface 205. In one example, the bus 210 and interface 205 are configured for transfers of a plurality of 16 bit words (e.g., 2, 4 or 8 words) from a corresponding plurality of cache cells at the speed of the cache clock. The interface 205 is configured to output data on I/O port 222 at an interface clock rate of an interface clock on line 221, which can be different than the clock rate of the cache clock, according to the configuration of the I/O port 222.

Figure 3:
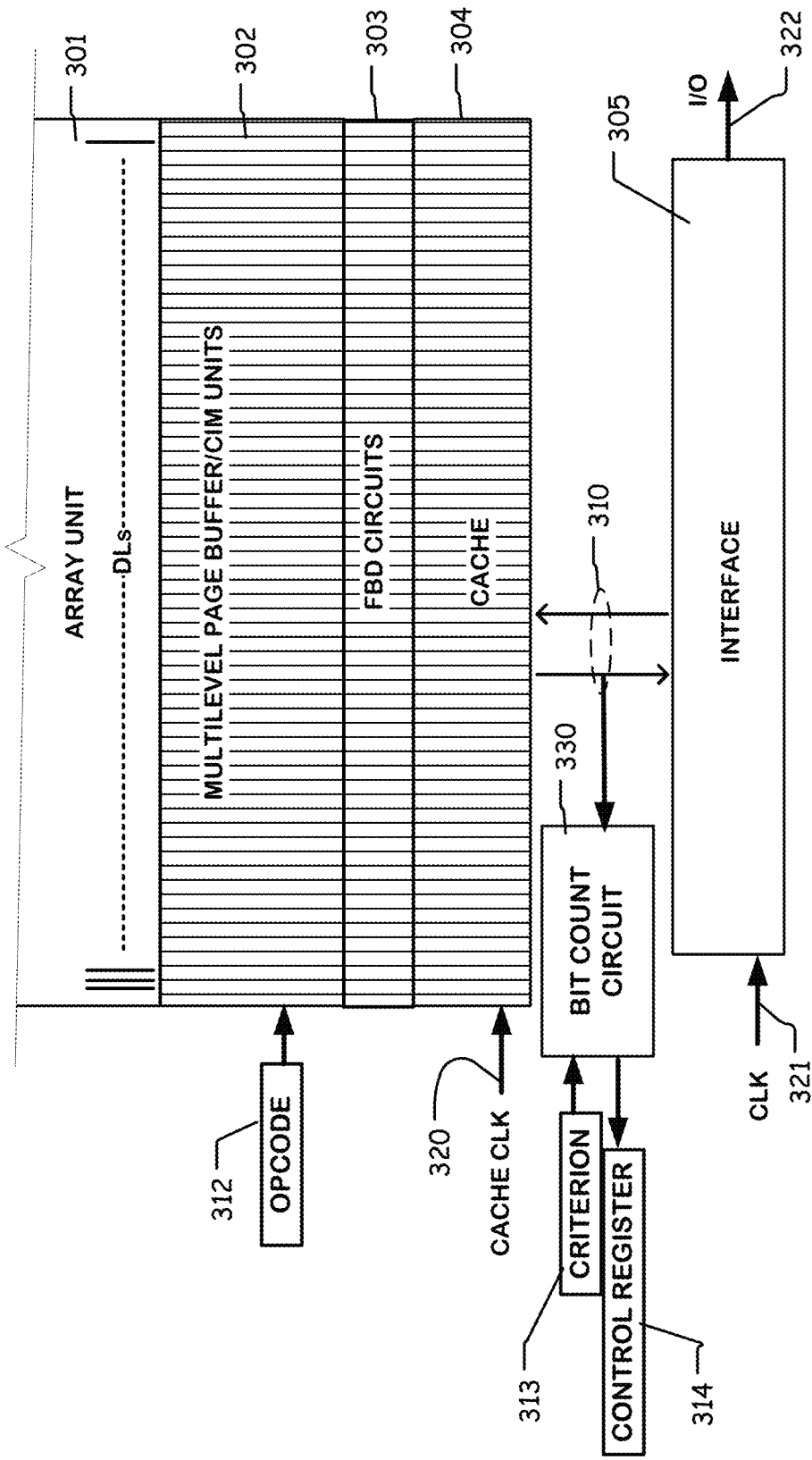
FIG. 3 is a simplified diagram of another example of data path circuits for a CIM device including embedded data analysis circuits.

FIG. 3 is a simplified diagram of an alternative configuration of the data path circuits between a memory array 301, such as the memory array 160 of FIG. 1, and an interface 305, such as the input/output interface 190 of FIG. 1. The data path circuits include a multilevel page buffer 302, failed bit detector circuits 303 and a cache 304. The multilevel page buffer 302 is divided as indicated by the vertical lines into a plurality of multilevel page buffer/CIM units. Each of the multilevel page buffer/CIM units can comprise a plurality of buffer cells. For example, a multilevel page buffer/CIM unit can comprise an array of 16 columns by 16 rows of buffer cells, coupled to 256 data lines of the memory array 301 in parallel.

Each of the buffer cells (see, e.g., FIG. 4) can comprise a plurality of storage elements and a logic unit that is configurable by an opcode 312, which can be stored in a control register or otherwise provided to set up the operation, to perform a selected logic function using data in the storage elements to generate an output and store the result. The result can be stored back into one of the storage elements in the plurality of storage elements of the buffer cell, and transferred to corresponding cache cells, or in some cases the result may be stored directly to the cache 304. The combination of the results from the plurality of buffer cells provides a results data page including operation results for the plurality of buffer cells. In some embodiments, the results data page includes results for the logic operations in all of the page buffer/CIM units. In other embodiments, the results data page includes results for the logic operations in a segment of the page buffer/CIM units.

The failed bit detection circuits 303 can be included in the data path circuits to perform analysis of the results of program verify operations or erase verify operations in the page buffer. In this example, the failed bit detection circuits generate a bit count of the number of "1" or "0" bits in the program or erase verify results, and provide the results to the controller or host, which determines a next step in the program operation.

The cache 304 is coupled to the multilevel page buffer 302 for high-speed transfer, for example, of data between selected storage elements in the buffer cells and the cache 304. The cache 304 is configured as a plurality of cache units, with each cache unit corresponding to one of the multilevel page buffer/CIM units. In an example in which the multilevel page buffer/CIM unit, which comprises an array of 16 columns by 16 rows of buffer cells, is coupled to 256 data lines of the memory array 301 in parallel, each cache unit can likewise comprise an array of 16 columns by 16 rows of cache cells, with one cache cell corresponding to each buffer cell. Each column of the 16×16 cache unit can store a 16 bit word transferred from the corresponding 16 buffer cells. Data, including the data of the results data page, can be moved in parallel between cache cells and selected storage elements in corresponding buffer cells at a relatively high speed, at the rate of the cache clock 320 for example.

The cache 304 is coupled by a bus 310 for read and write transfers with the interface 305. In one example, the bus 310 and interface 305 are configured for transfers of a plurality of 16 bit words (e.g., 2, 4 or 8 words) from a corresponding plurality of cache cells at the speed of the cache clock. The interface 305 is configured to output data on I/O port 322 at an interface clock rate of an interface clock on line 321, which can be different than the clock rate of the cache clock, according to the configuration of the I/O port 322.

The data path circuit includes bit count circuit 330 connected to the bus 310, or otherwise configured to access data in the cache. The bit count circuit 330 performs analysis of the results of the logic operations in the page buffer. In this example, the analysis is a bit count of the number of "1" or "0" bits in the results data page, and includes a comparison of the count to a criterion 313. The analysis also outputs pass/fail results in a control register 314. The criterion 313 can be stored in a control register or otherwise provided to set up the analysis operation. In some embodiments, the bit count circuit like that shown in FIG. 3 can be included on a device configured as shown in FIG. 2, so that there is a plurality of data analysis circuits configured to analyze results data pages from CIM operations executed in the page buffer, in the data path circuits between the memory array and the interface.

The pass/fail results in the control register 314 can include a parameter indicating whether the results data page as a whole passes the criterion, or in cases in which the results data page is divided into segments, to include parameters indicating which segments of the results data page pass the criterion, or to include both a parameter indicating whether the results data page as a whole passes the criterion, and parameters indicating which segments of the results data page pass the criterion.

The bit count circuits 203 of FIG. 2, and the bit count circuit 330 of FIG. 3, are each examples of a data analysis circuit connected to the data path circuits, to execute a function of the results data page to generate an analysis result. In other embodiments, the data analysis circuit can execute a data matching operation, comparing the results data page or segments of the results data page to a constant provided by as the criterion for the analysis. In other embodiments, the data analysis circuit can perform a logic or computation operation over multiple bit sets in the results data page; then count the operation result and report the count, or compare the count with the threshold to make a PASS or FAIL judgement by writing a status bit to a status register.

In one example procedure, the CIM circuits in the page buffer can be configured to compute a bit-by-bit XOR operation over data from the array and a master data stored in the page buffer from another source, which produces a results data page in one cycle across the page, that includes a "0" if the bits in the array data and master data in the page buffer cell do not match and a "1" if the bits in the array data and master data in the page buffer cell do match. The data analysis circuits can be configured to count the number of matching bits by counting the "1's" in the results data page. Also, in some examples, the data analysis circuits can execute a logic operation over multiple bits in the results data page, and then generate an analysis result, such as a count or pass/fail status using as input the results of the logic operation. In one implementation, the data analysis circuit is be configured to perform an AND operation over neighbor bits (e.g., bit(i) AND bit(i+1) for i going from 0 to N−1, where N is the number of bits in the results data page), to produce operations results having N/2 bits. Also, the data analysis circuit can be configured to perform operations over more than two bits in the results data page, or to perform other functions as suit a particular need.

The data analysis circuits can execute in multiple cycles, applying the analysis operation 1K times in for example a 16B segments, over a 16 KB results data page.

Figure 4:
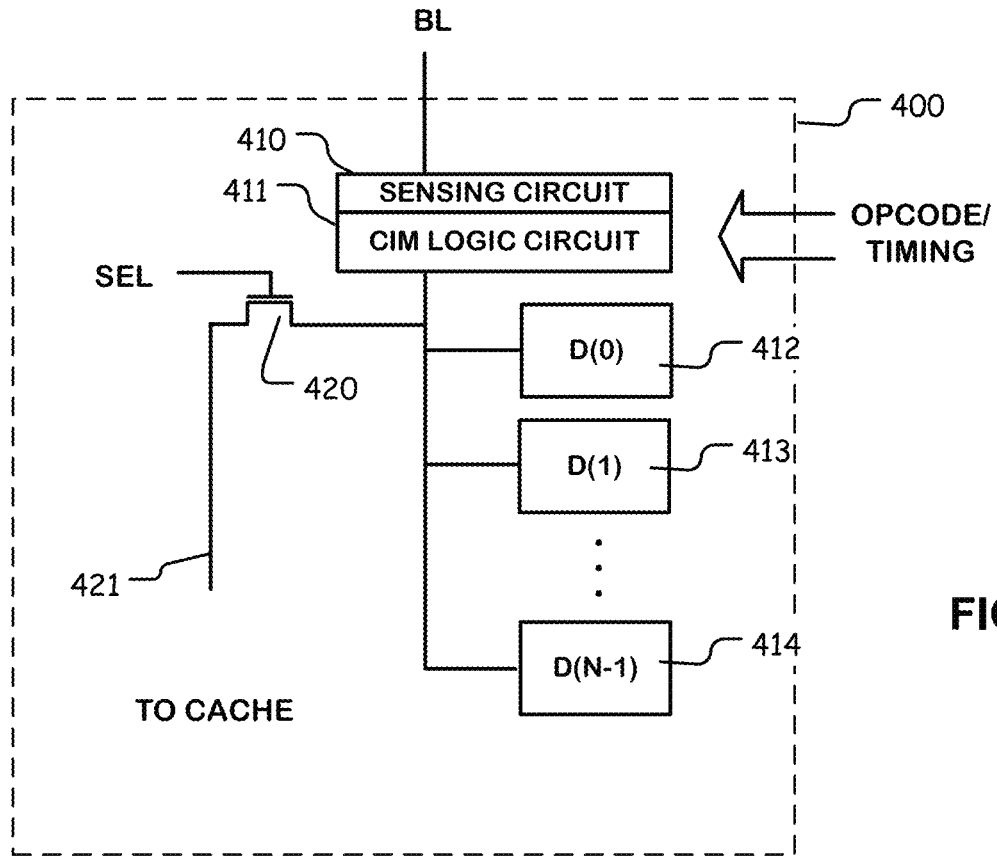
FIG. 4 is a diagram of a page buffer cell including a plurality of data elements and CIM logic circuits.

FIG. 4 is a simplified diagram of a buffer cell 400 which could be used in a multilevel page buffer/CIM unit including a plurality of such buffer cells arranged in an array, as described with respect to FIGS. 1, 2 and 3.

The buffer cell 400 includes a sensing circuit 410 coupled to a bit line BL or other type of data line from the memory array. Also, the buffer cell 400 is connected to a CIM logic circuit 411, which can be part of the buffer cell. The CIM logic circuit 411 is used for memory read and write operations and for CIM operations. The buffer cell 400 includes a plurality of storage elements 412-414, such as a storage element storing data bit D0, a storage element storing data bit D1, . . . , and a storage element storing data bit Dn. For examples, a buffer cell can include three, four or five storage elements. The plurality of storage elements 412-414 are coupled to a sensing circuit 410, and to logic circuit 411 by a circuit which links a particular storage element to the logic circuit for particular operations. Also, the plurality of storage elements 412-414 are coupled by a selector such as pass gate 420 to line 421, which is in turn connected to a corresponding cache cell.

The CIM logic circuit 411 includes in this example combinational logic circuits which are selectable in response to an opcode provided by a configuration register or a command for use in a given CIM operation. Also, the CIM logic circuit 411 includes circuits responsive to timing signals and the opcode to connect the inputs of the logic gates to selected ones of the storage elements storing data bits D(0) to D(N-1) and to the line 421 from a corresponding cache cell, and to connect the output of the logic circuits to a selected one of the storage elements storing data bits D(0) to D(N-1), and optionally to the line 421 from a corresponding cache cell. The opcode or control signals generated in response to decoding of the opcode can be applied to all the page buffer cells of segment or page in some examples. Also, the buffer cell 400 is responsive to the SEL signal and other control signals to transfer data from a selected one of the storage elements storing data bits D0 to D(N-1), on line 421 to a corresponding cache cell in a corresponding cache unit.

The CIM logic circuit 411 can be configured to execute one logic operation, or more than one logic operation in sequence in response to one opcode or multiple opcodes, before the results are transferred to the cache or applied to data analysis circuits.

A page buffer includes a plurality of page buffer cells P(i), for i=0 to M-1, where M is the number of data lines connected to the page buffer to transfer data from of M memory cells to the page buffer. Each of the page buffer cells can have storage elements for bits D(0) to D(N-1), and in combination form N lines of storage elements in the page buffer. Each line of storage elements of the plurality of lines in the page buffer can store M bits in this example. Also, the M bits can be loaded in parallel to a line in the page buffer in a read operation from the memory array, or in a write operation from another source, such as another line in the page buffer, from a cache coupled to the page buffer or from another data path in response to operation control procedures controlled by a host or by other control logic.

Table 1 below illustrates one example opcode set which supports selecting logic operations in the page buffer. In the first column, a name of the logic operation is provided. In columns two through four, bits [2:0] of the opcode are provided. In column five, the function if applied to a first operation is provided. In column six, the function if applied as a second operation, which can be in sequence with the first operation, is provided. Of course, the arrangement of operations and opcodes can be defined as desired for a given implementation.

For example, the XOR opcode sets up a first XOR operation and a second XOR operation which can be executed in sequence, or separately. The first XOR performs an XOR of "input 1" and "read data". The output of the first XOR is stored as data bit D1 in a selected storage element. The "input 1" can comprise data provided by a host command to transfer data from the cache or the IO interface to the page buffer, where it is positioned in a selected storage element such as storage element 414, in the plurality of buffer cells. The "read data" is data transferred from the memory array via the sensing circuit 410 into a selected storage element and stored for example as data bit D0. The second XOR performs an XOR of "input 2" and "D1", where the data in D1 can be generated by the first XOR operation, or by a different first logic operation defined in the table of opcodes. The data "input 2" can be provided by the host in a transfer from the cache memory or from the IO interface. The output of the second XOR is stored as data bit D2 in a selected storage element. In some examples of the technology provided here, both "input 1" and "input 2" for a given operation may be written to corresponding lines in the page buffer from the host in a transfer from the cache memory or from the IO interface.

The other opcodes can be interpreted as discussed with respect to the XOR opcode as well. In some embodiments, one opcode from the table can be used to identify both OP1 and OP2, which can be executed in sequence. In the Examples in TABLE 1, both the first and second opcodes select the same logic function using different inputs. In other examples, the first and second opcodes can select different logic functions. In some examples, to execute different functions, two opcodes from the table are selected in sequence, one for the first operation and one for the second operation.

TABLE 1

| Logic OP | 2 | 1 | 0 | OP1 | OP2 |
|---|---|---|---|---|---|
| XOR | 0 | 0 | 0 | D1 = XOR(Input 1, read data) | D2 = XOR(Input 2, D1) |
| AND | 0 | 0 | 1 | D1 = AND(Input 1, read data) | D2 = AND(Input 2, D1) |
| OR | 0 | 1 | 1 | D1 = OR(Input 1, read data) | D2 = OR(Input 2, D1) |
| XNOR | 1 | 0 | 0 | D1 = XNOR(Input 1, read data) | D2 = XNOR(Input 1, D2) |
| NOT | 1 | 0 | 1 | D1 = NOT(read data) | D2 = NOT(D1) |
| NAND | 1 | 1 | 0 | D1 = NAND(Input 1, read data) | D2 = NAND(Input 2, D1) |
| NOR | 1 | 1 | 1 | D1 = NOR(Input 1, read data) | D2 = NOR(Input 2, D1) |

Figure 5:
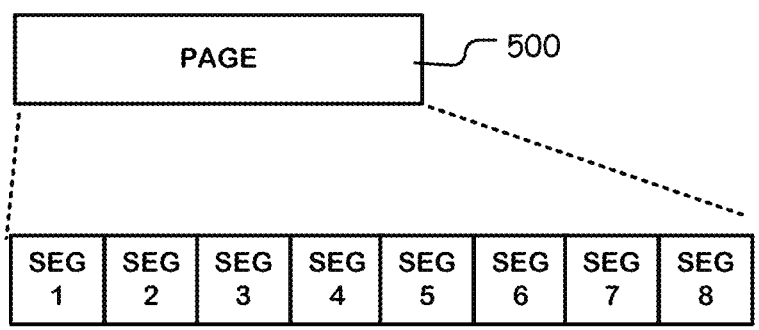
FIG. 5 illustrates a segmentation of a page which can be utilized in connection with data analysis circuits as described herein.

FIG. 5 illustrates a segmentation of a page which can be applied in some embodiments. As illustrated in FIG. 5, a page 500 is an amount of data transferred in parallel from the memory array to the page buffer. A page can comprise for example 16 kB plus 2 kB extra data. In some devices the pages are smaller or larger as suits a particular configuration. Page 500 is divided into eight segments as shown in FIG. 5: SEG 1 to SEG 8. As mentioned above, the data analysis circuits can operate on a segment basis, providing analysis results for each of the eight segments. Other segmentations can be applied as suits a particular need.

FIGS. 6-8 illustrate example control registers which can be used on a device such as described with reference to FIG. 1, to provide setup data (e.g., opcodes, criterion and addressing) defining features of the CIM operation, and to provide results data (e.g., pass/fail and count data) accessible by the host using register read and write operations.

FIG. 6 illustrates a feature control register which has a CIM control feature address with first and second parameters. First parameter P1 points to a register holding a criterion AD1BN (e.g., allowable 1 bits number) to be applied in the data analysis circuit. The second parameter P2 points to a register holding a first bit OP # indicating the number of logic operations to be executed in the page buffer cells, a second bit INTK used to enable the data analysis circuit, the first opcode field OP2 identifying the second operation to be executed when indicated by the OP # bit, and a second opcode field OP1 identifying the first operation to be executed. Note that in the embodiments discussed with respect to TABLE 1, only one opcode field might be utilized. In this example, the bit OP # is set if both opcodes are to be executed. If the bit OP # is not set, then only the first opcode is executed.

FIG. 7 illustrates a status control register having eight bits. The first seven bits M to S can be status bits related to ordinary memory operations, or other functions on the device. The last status bit FAIL indicates results of the data analysis. In a segmented system, the bit FAIL is set (or reset) to indicate a failed status in one example by the data analysis circuit if all of the segments fail the criterion, or reset (or set) to indicate a passed status, if at least one segment passes. A host operating the memory device can read the status control register to determine the analysis result.

FIG. 8 illustrates an internal check feature control register having an address and a parameter field P1. An embodiment in which the results data page is segmented into eight segments, the internal check feature control register of FIG. 8 can store pass fail P/F bits for each of the eight segments as illustrated.

The configuration of the control registers to be used in a given implementation can be adapted to fit the types of functions being executed.

Figure 9:
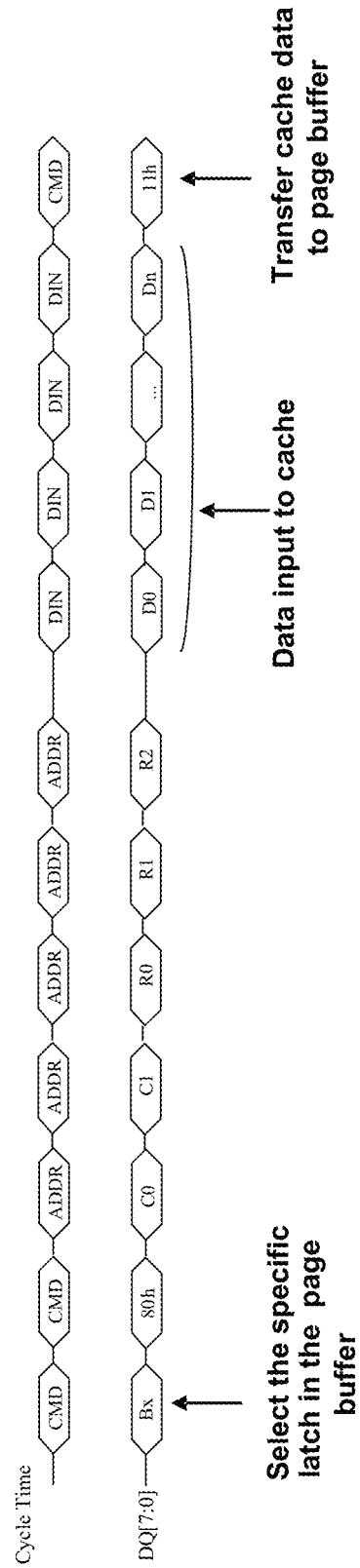
FIG. 9 is a timing diagram of an example sequence of command, addresses and data used to store data from the input/output interface in selected storage elements of the plurality of buffer cells of a page buffer.

FIG. 9 is a timing diagram illustrating a command sequence that can be generated in a host to set input data in selected storage elements of the buffer cells of the page buffer. This command sequence is similar to sequences used in a three-level memory where each bit to be stored in the multilevel memory cell is written to a specific latch of the page buffer. In the sequence illustrated in FIG. 9, two command bytes CMD provide a cache transfer command. The command decoder and the controller in the device set up a cache write operation. Next, five address bytes provide column and row addresses in support of the write to the cache. The command decoder and controller in the device decode the address to set up cache addresses in support of the write to the cache. A sequence of data bytes is input, and the write operation is executed by the controller to store data in the cache. Finally, a command byte is input to cause a transfer of the cache data to the page buffer. The controller and command decoder execute a procedure to transfer the data to the specified line of storage elements (Dx) in the page buffer. Similar command sequences can be implemented to accomplish other functions related to the movement of data to be utilized in, and data generated by, CIM operations.

Figure 10:
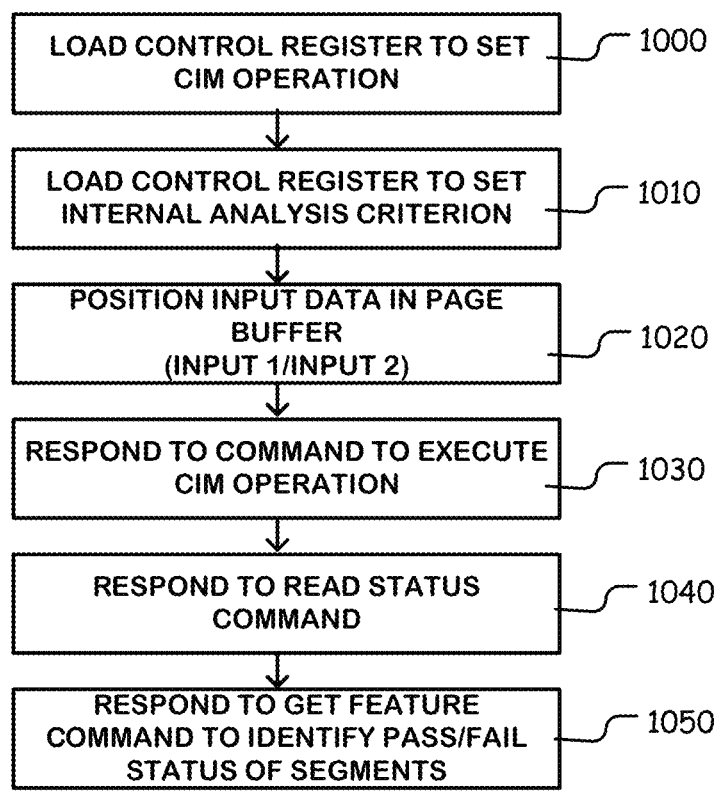
FIG. 10 is a simplified flowchart of operations implemented on a CIM device in support of a CIM operation as described herein.

FIG. 10 is a simplified flowchart of steps executed in the device in support of the CIM operation with data analysis as described herein. In this flowchart, first, a feature control register is loaded with parameters to set the CIM operation, an example of which is the P2 row in the control register shown in FIG. 6 (1000). This operation can be executed in response to a write register command received by the device from the host. Also, the steps include loading the feature control register to set the internal analysis criterion for the data analysis, an example of which is the P1 row of the control register shown in FIG. 6 (1010). To execute the specified operation, input data is positioned in selected line of storage elements of the page buffer cells to provide the inputs, in this case INPUT 1 and INPUT 2, used by the specified logic function (1020). The memory device can then respond to a command or other signal to execute the specified logic operation, store the results in the one of the lines of storage elements of the page buffer cells to provide a results data page across the cells of the page buffer, analyze the results data page and provide analysis results stored in memory locations accessible by the host (1030). A host application utilizing the function can then issue a read status command, and the device responds to the read status command to provide the results of the data analysis according to the internal analysis criterion (1040). These results can be stored in a status control register as discussed above with respect to FIG. 7. Also, the host application utilizing the function can issue a command, such as a get feature command to read a control register that stores more details concerning the results of the analysis, such as the register discussed above with respect to FIG. 8 (1050). Thus, the memory device responds to the get feature command to provide the requested data to the host via the input/output port on the device, such as the pass/fail status of segments of the results page.

Figure 11A:
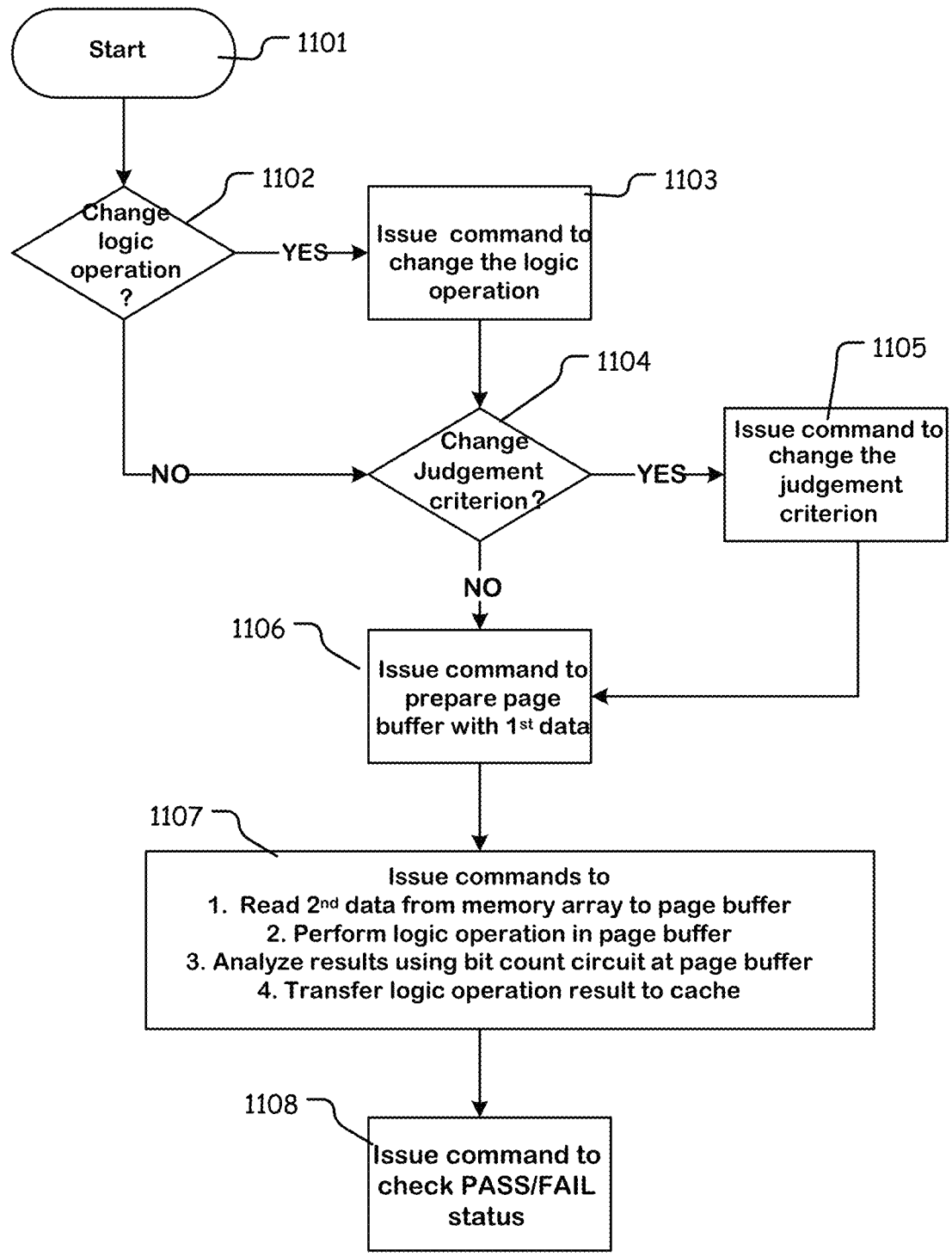
FIGS. 11A and 11B are simplified flowcharts of a CIM operation utilizing data analysis of a results data page in the page buffer as described herein.

FIG. 11A is a flowchart of a CIM operation as described herein to be executed on data read from the memory array, with the internal data analysis. This operation can be executed using for example the INTK parameter discussed above with respect to FIG. 6, and an embodiment providing that function. In this example, the procedure starts (1101). It is determined whether to change the set logic operation on the memory device (1102). If it is desired to change the logic operation, then the host issues a command to change the logic operation (1103). If no change to the logic operation is to be executed, or after changing the logic operation at step 1103, then it is determined whether to change the judgment criterion for the analysis of the results data page (1104). If it is desired to change the judgment criterion, then a command is issued to change the judgment criterion (1105). If there is no change of the judgment criterion at step 1104, or after the change is executed at step 1105, then a command is issued to prepare the page buffer with the first data set to be used as input to the selected operation (1106). This can involve an operation such as discussed with respect to FIG. 9. Alternatively, it can involve moving data (such as data of a page previously read from the memory array) from one set of storage elements, such as one line, in the page buffer to another set of storage elements, such as another line, in the page buffer. After preparing the first data in the page buffer, a single command, or alternatively a command sequence, is executed to perform a procedure using a state machine or other control circuit to read the second data set (e.g., a page or a segment of a page) from the memory array to the page buffer, to perform the bit-by-bit logic operation in the page buffer, to analyze the results data page using the bit count circuit, or other data analysis circuit, at the page buffer and to transfer the results data page of the logic operation to the cache (1107). After latency sufficient to allow for writing of the status control registers, the host can then issue a command or commands to read the register or registers holding the results of the data analysis operation, such as the pass/fail status of the data analysis operation (1108).

Figure 11B:
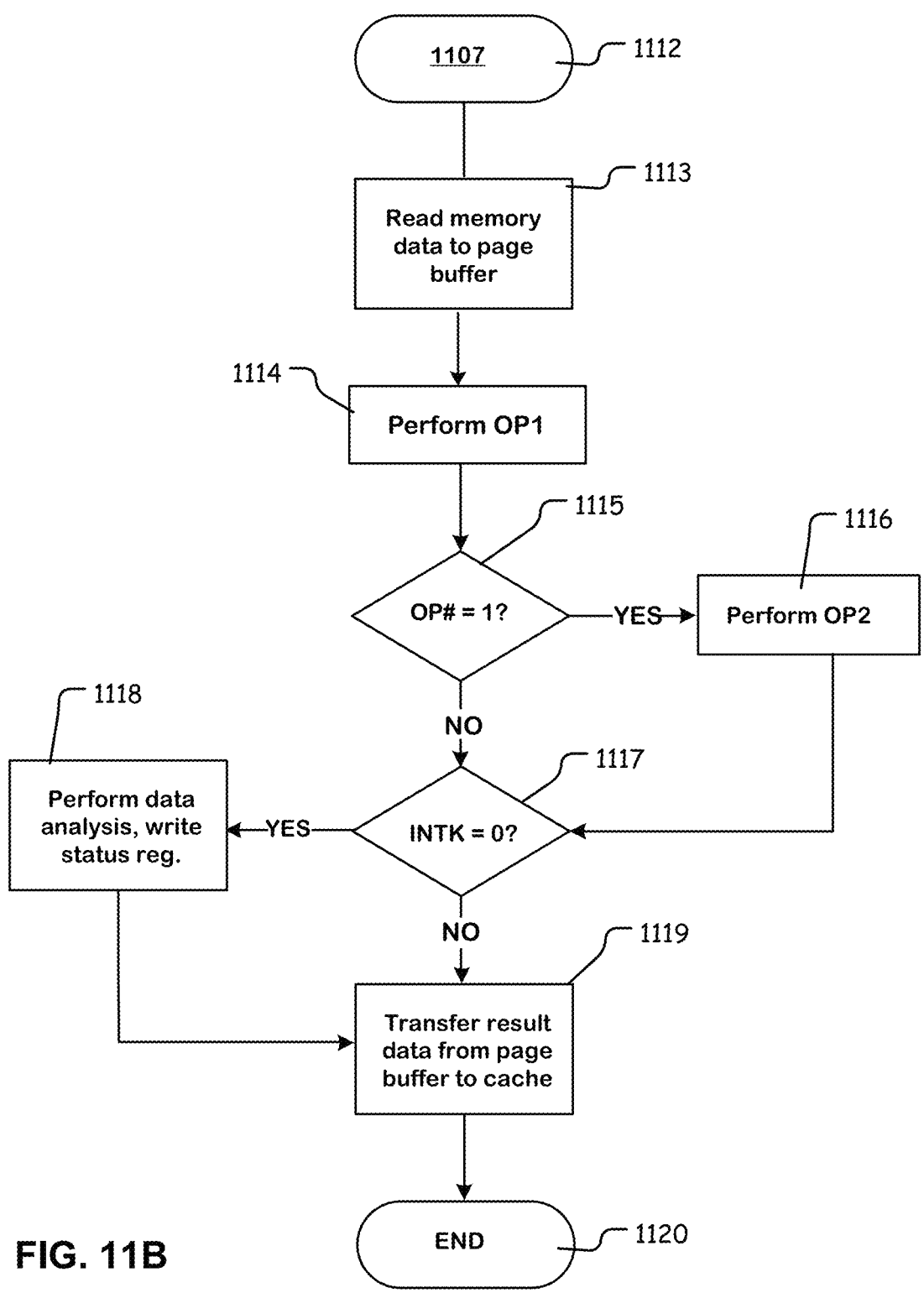

FIG. 11B is a flow chart of one example of a procedure represented by step 1107 of FIG. 11A which can be executed by state machine in response to decoding of a single external command using a command decoder on an integrated circuit memory for example. The flowchart starts at step 1107 of FIG. 11A (1112). In response to the command, memory data is read from the memory array into a line of the page buffer (1113). The opcode OP1 to be used for the first operation is applied, and logic circuits in the page buffer are used to perform OP1 (1114). Then, it is determined whether a second opcode is to be executed in this example by looking at the parameter OP #(1115). The first and second opcode can identify the same logic function, such as illustrated in Table 1 above, or can identify different logic functions. If a second opcode is to be executed, then the second operation is performed (1116). If only one opcode is to be executed, or after the second opcode is executed at step 1116, it is determined where whether a data analysis step is to be executed internally by checking the parameter in this example INTK (1117). If a data analysis step is to be performed, then it is executed and the results written to status control register (1118). After writing result to the status control register or if internal data analysis is kept, the results of the logic operations are transferred from the page buffer to the cache where is available for access by the host (1119). At this point, the procedure of step 1107 of FIG. 11A is completed (1120).

Figure 12A:
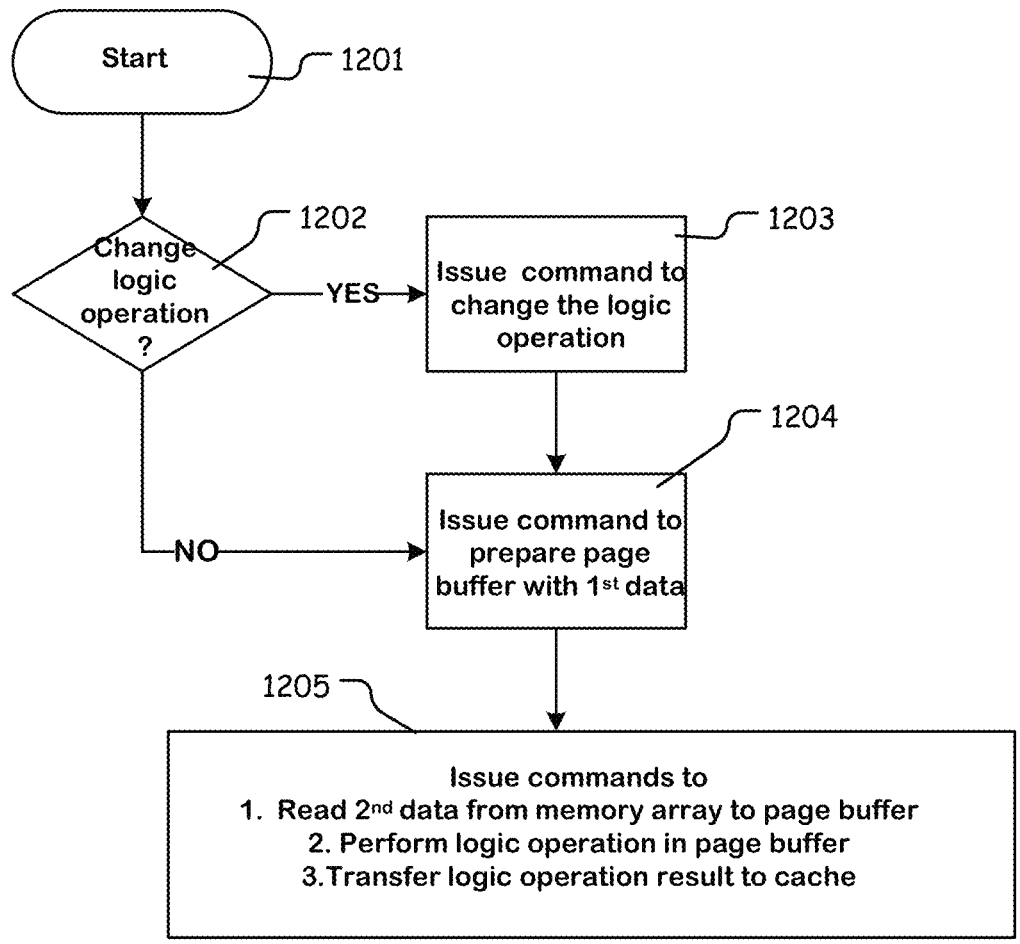
FIGS. 12A and 12B are simplified flowcharts of a CIM operation without the internal data analysis, such as when the internal data analysis is turned off, or not included on the CIM device.

FIG. 12A is a flowchart of a CIM operation as described herein to be executed on data read from the memory array, without utilizing the internal data analysis. This operation can be executed using for example the INTK parameter discussed above with respect to FIG. 6, and an embodiment providing that function. In this example, the procedure starts (1201). It is determined whether to change the set logic operation on the memory device (1202). If it is desired to change the logic operation, then the host issues a command to change the logic operation (1203). If no change to the logic operation is to be executed, or after changing the logic operation at step 1203, then a command is issued to prepare the page buffer with the first data set to be used as input to the selected operation (1204). This can involve an operation such as discussed with respect to FIG. 9. Alternatively, it can involve moving data (such as data of a page previously read from the memory array) from one set of storage elements in the page buffer to another set of storage elements in the page buffer. The controller on the device can determine that no internal data analysis is to be used for this operation in response to the setup data as discussed above, in embodiments including that function. After preparing the first data in the page buffer, a single command, or alternatively a command sequence, is executed to perform a procedure using a state machine or other control circuit to read the second data set from the memory array to the page buffer, to perform the logic operation in the page buffer, and to transfer the results data page of the logic operation to the cache (1205).

Figure 12B:
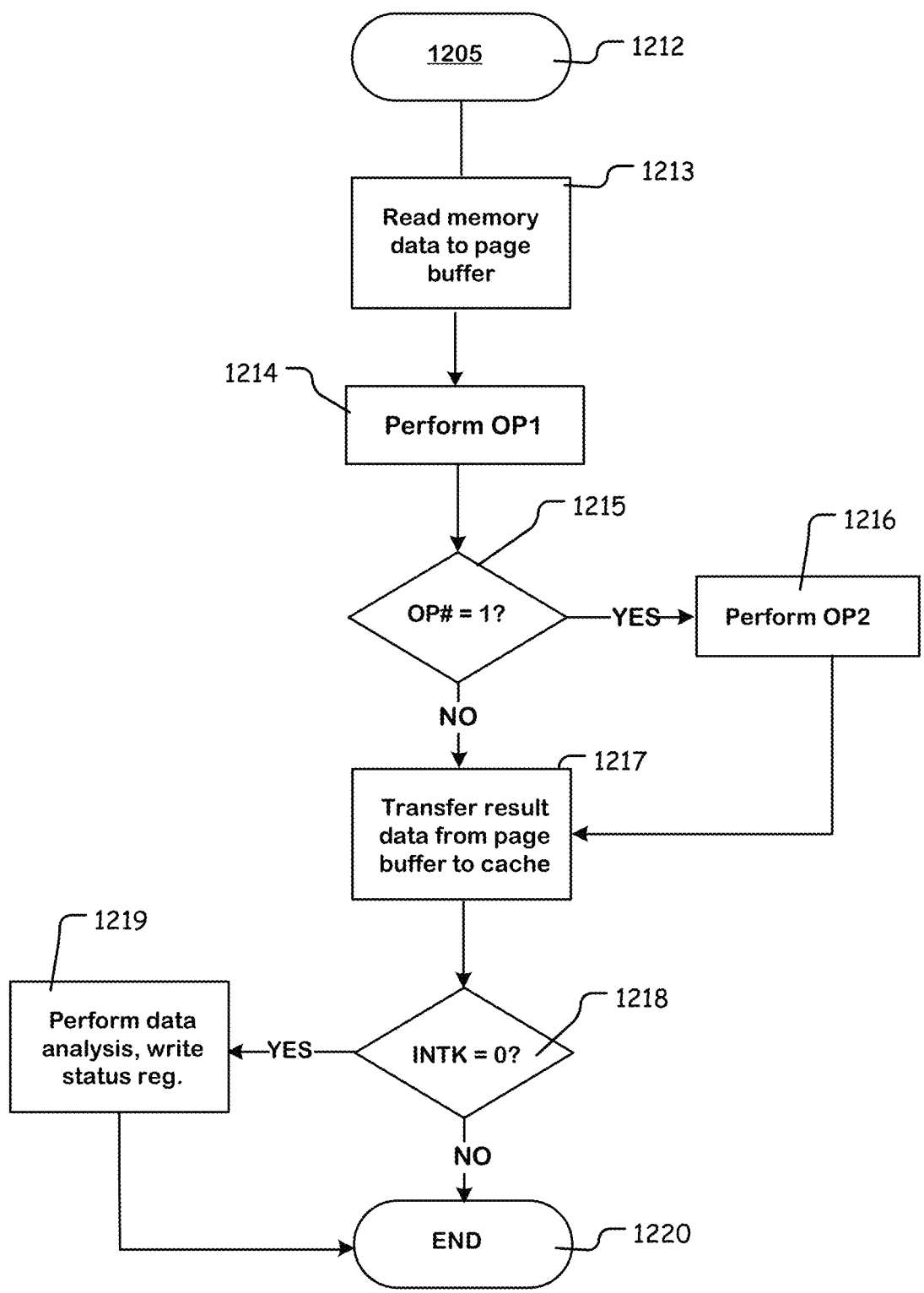

FIG. 12B is a flow chart of one example of a procedure represented by step 1205 of FIG. 12A which can be executed by state machine in response to decoding of a single external command using a command decoder on an integrated circuit memory for example. The flowchart starts at step 1205 of FIG. 12A (1212). In response to the command, memory data is read from the memory array into the page buffer (1213). The opcode OP1 to be used for the first operation is applied, and logic circuits in the page buffer are used to perform OP1 (1214). Then, it is determined whether a second opcode is to be executed in this example by looking at the parameter OP #(1215). The first and second opcode can identify the same logic function, such as illustrated in Table 1 above, or can identify different logic functions. If a second opcode is to be executed, then the second operation is performed (1216). If only one opcode is to be executed, or after the second opcode is executed at step 1216, the results of the logic operations are transferred from the page buffer to the cache (1217). It is then determined whether an internal analysis is to be executed by checking the parameter INTK in this example (1218). If internal analysis is to be performed using the data in the cache, and the data analysis is performed and results are written to a status control register (1219). After completion of the internal data analysis, or if no data analysis to be executed, then the procedures ended and the results data remains available in the cache for access by the host (1220).

Figure 13:
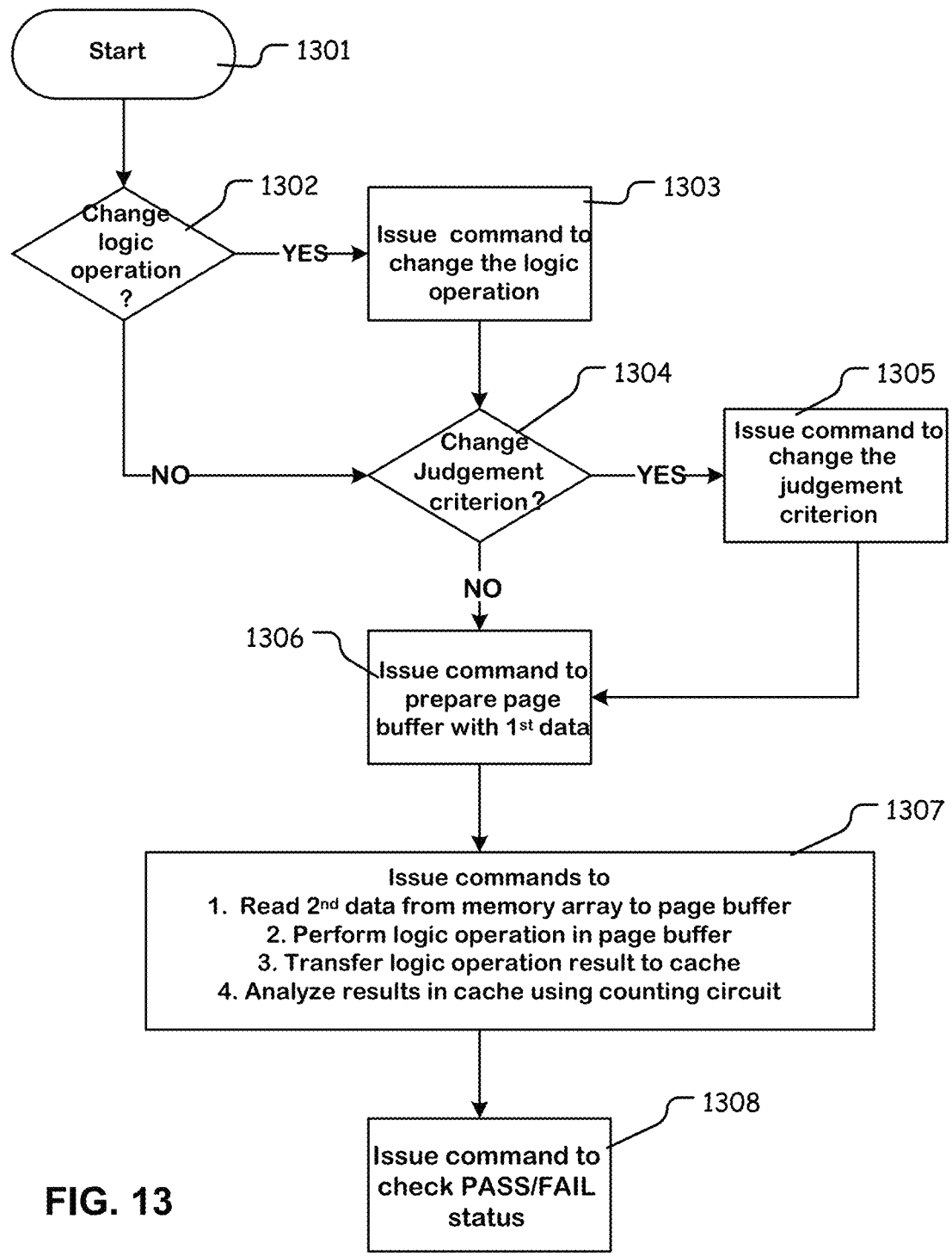
FIG. 13 is a simplified flowchart of a CIM operation using data analysis of a results data page in the cache as described herein.

FIG. 13 is a flowchart of a CIM operation as described herein to be executed on data read from the memory array, with the internal data analysis executed after the results data page is transferred to the cache, using an embodiment in which there is a data analysis circuit coupled to the cache as described with respect to FIG. 3. This operation can be executed using for example the INTK parameter discussed above with respect to FIG. 6, in an embodiment providing that function. In this example, the procedure starts (1301). It is determined whether to change the set logic operation on the memory device (1302). If it is desired to change the logic operation, then the host issues a command to change the logic operation (1303). If no change to the logic operation is to be executed, or after changing logic operation at step 1303, then it is determined whether to change the judgment criterion for the analysis of the results data page (1304). If it is desired to change the judgment criterion, then a command is issued to change the judgment criterion (1305). If there is no change of the judgment criterion at step 1304, or after the change is executed at step 1305, then a command is issued to prepare the page buffer with the first data set to be used as input to the selected operation (1306). This can involve an operation such as discussed with respect to FIG. 9. Alternatively, it can involve moving data (such as data of a page previously read from the memory array) from one set of storage elements in the page buffer to another set of storage elements in the page buffer. After preparing the first data in the page buffer, a single command, or alternatively command sequence, is executed to perform a procedure using a state machine or other control circuit to read the second data set (e.g., a page or a segment of a page) from the memory array to the page buffer, to perform the bit-by-bit logic operation in the page buffer, to transfer the results data page of the logic operation to the cache, and to analyze the results data page in the cache using the bit count circuit, or other data analysis circuit (1307). In one example, the procedure represented by step 1307 can be like that of step 1205 of FIG. 12A, and can proceed as described above with reference to FIG. 12B. After latency sufficient to allow for writing of the status control registers, the host can then issue a command or commands to read the register or registers holding the results of the data analysis operation, such as the pass/fail status of the data analysis operation (1308).

Figure 14A:
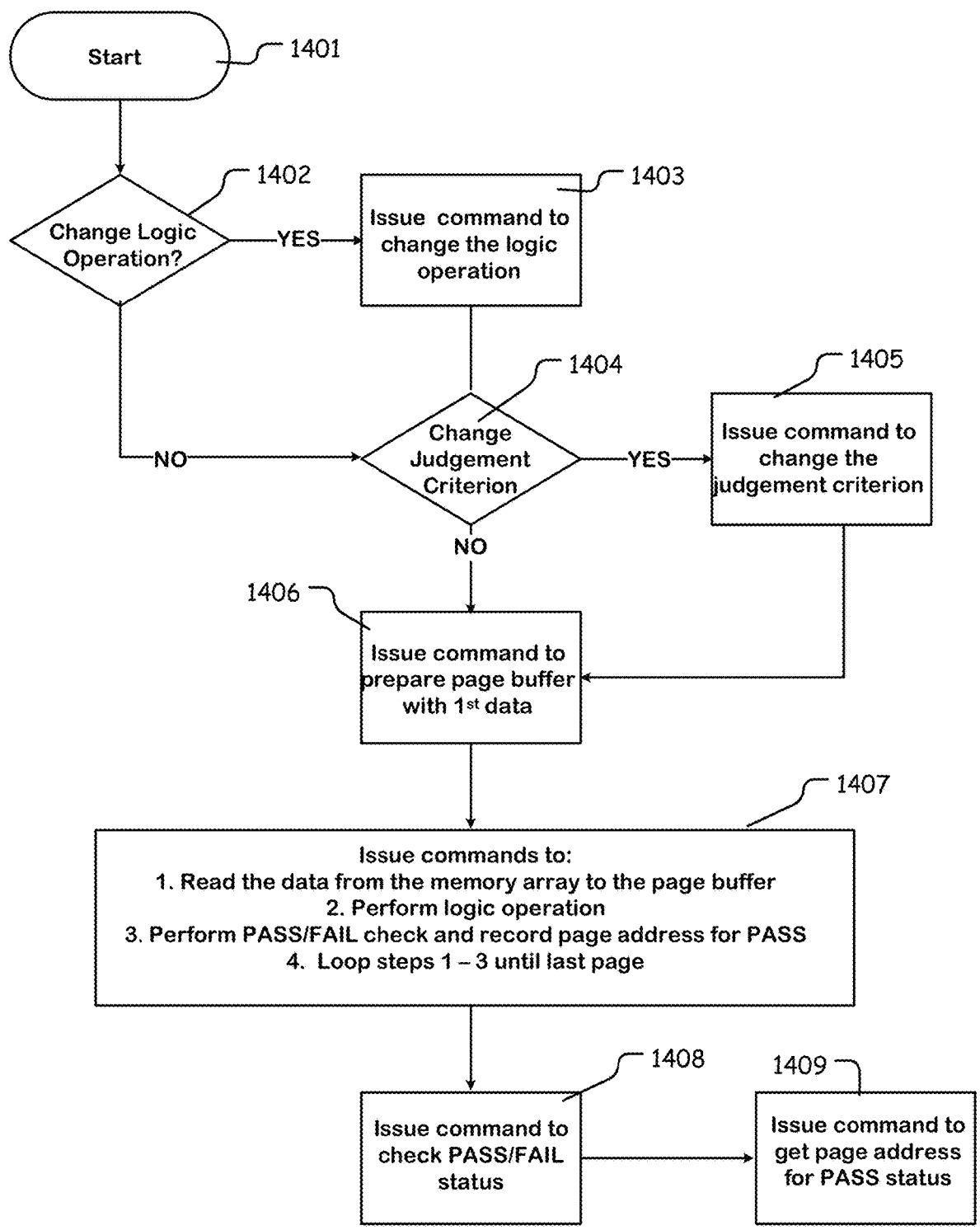
FIGS. 14A, 14B and 14C are simplified flowcharts of a CIM operation executed over a plurality of pages in sequence with data analysis as described herein.

FIG. 14A is a flowchart of a CIM operation as described herein to be executed on data read from the memory array, with the internal data analysis executed over the results data page either in the page buffer or cache as discussed above in connection with FIG. 2 and FIG. 3, for a case in which the host is analyzing a plurality of pages in sequence. This operation can be executed using for example the INTK parameter discussed above with respect to FIG. 6, in an embodiment providing that function. In this example, the procedure starts (1401). It is determined whether to change the set logic operation on the memory device (1402). If it is desired to change the logic operation, then the host issues a command to change the logic operation (1403). If no change to the logic operation is to be executed, or after changing the logic operation at step 1403, then it is determined whether to change the judgment criterion for the analysis of the results data page (1404). If it is desired to change the judgment criterion, then a command is issued to change the judgment criterion (1405). If there is no change of the judgment criterion at step 1404, or after the change is executed at step 1405, then a command is issued to prepare the page buffer with the first data set to be used as input to the selected operation (1406). This can involve an operation such as discussed with respect to FIG. 9. Alternatively, it can involve moving data (such as data of a page previously read from the memory array) from one set of storage elements in the page buffer to another set of storage elements in the page buffer. After preparing the first data in a line of the page buffer, a single command, or alternatively command sequence, is executed to perform a procedure using a state machine or other control circuit to apply the analysis to a sequence of pages. The procedure can include a an operation to read the data of a page (e.g., a page or a segment of a page) from the memory array to a line of the page buffer, to perform the bit-by-bit logic operation in the page buffer over the read data and data in another line of the page buffer, or in the cache, to transfer the results data page of the logic operation to the cache, and to analyze the results data page in the cache using the bit count circuit, or other data analysis circuit to produce pass/fail results, and in this embodiment store a page address for a page that passes the criterion of the data analysis, and to loop through the steps until the last page of the sequence is analyzed (1407). The page addresses of passing pages can be stored in the device for access by the host after completion of the procedure, using additional status control registers on the memory device. After latency sufficient to allow for writing of the status control registers, the host can then issue a command or commands to read the register or registers holding the results of the data analysis operation, such as the pass/fail status of the data analysis operation (1408). Alternatively, the pass/fail status can be maintained for the entire sequence of pages in support of the step 1408. If all the pages pass, then the procedure is completed. If there is a failed page, then the host can issue a command to get data indicating which pages pass and which pages fail, such as the page addresses for the passing pages (1409).

Figure 14B:
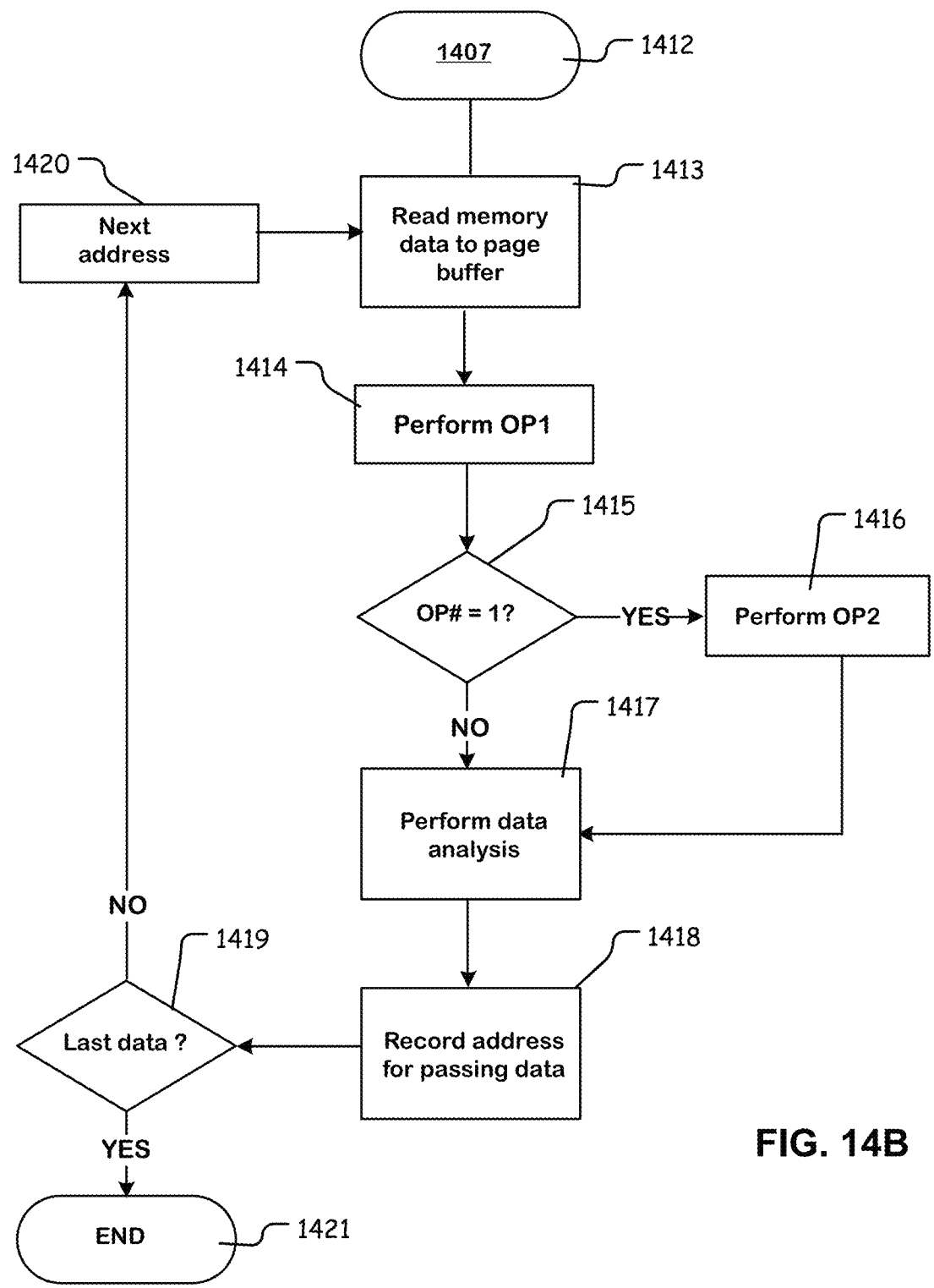

FIG. 14B is a flow chart of one example of a procedure represented by step 1407 of FIG. 14A which can be executed by state machine in response to decoding of a single external command using a command decoder on an integrated circuit memory for example, for a case on which the data analysis circuits are connected to the page buffer. The flowchart starts at step 1407 of FIG. 14A (1412). In response to the command including a starting address and an indication of a number of addresses such as an ending address or a sequence length parameter), memory data is read from the memory array into a line of the page buffer (1413). The opcode OP1 to be used for the first operation is applied, and logic circuits in the page buffer are used to perform OP1 over the read data and data in another line of the page buffer and store operation results to a line in the page buffer (1414). Then, it is determined whether a second opcode is to be executed in this example by looking at the parameter OP #(1415). The first and second opcode can identify the same logic function, such as illustrated in Table 1 above, or can identify different logic functions. If a second opcode is to be executed, then the second operation is performed over data in corresponding lines of the page buffer (1416). If only one opcode is to be executed, or after the second opcode is executed at step 1416, then the data analysis step is to be executed using the results data in the page buffer for the current data (1417). After the data analysis step, the address for passing data is written to a status control register (1418). Then the procedure determines whether a last page of data of the sequence has been analyzed (1419). If not, then a next address is generated (1420) and the data from the next address is read at step 1413, and the procedure continues until the last page. When last page is indicated at step 1419, then the procedure ends (1421).

Figure 14C:
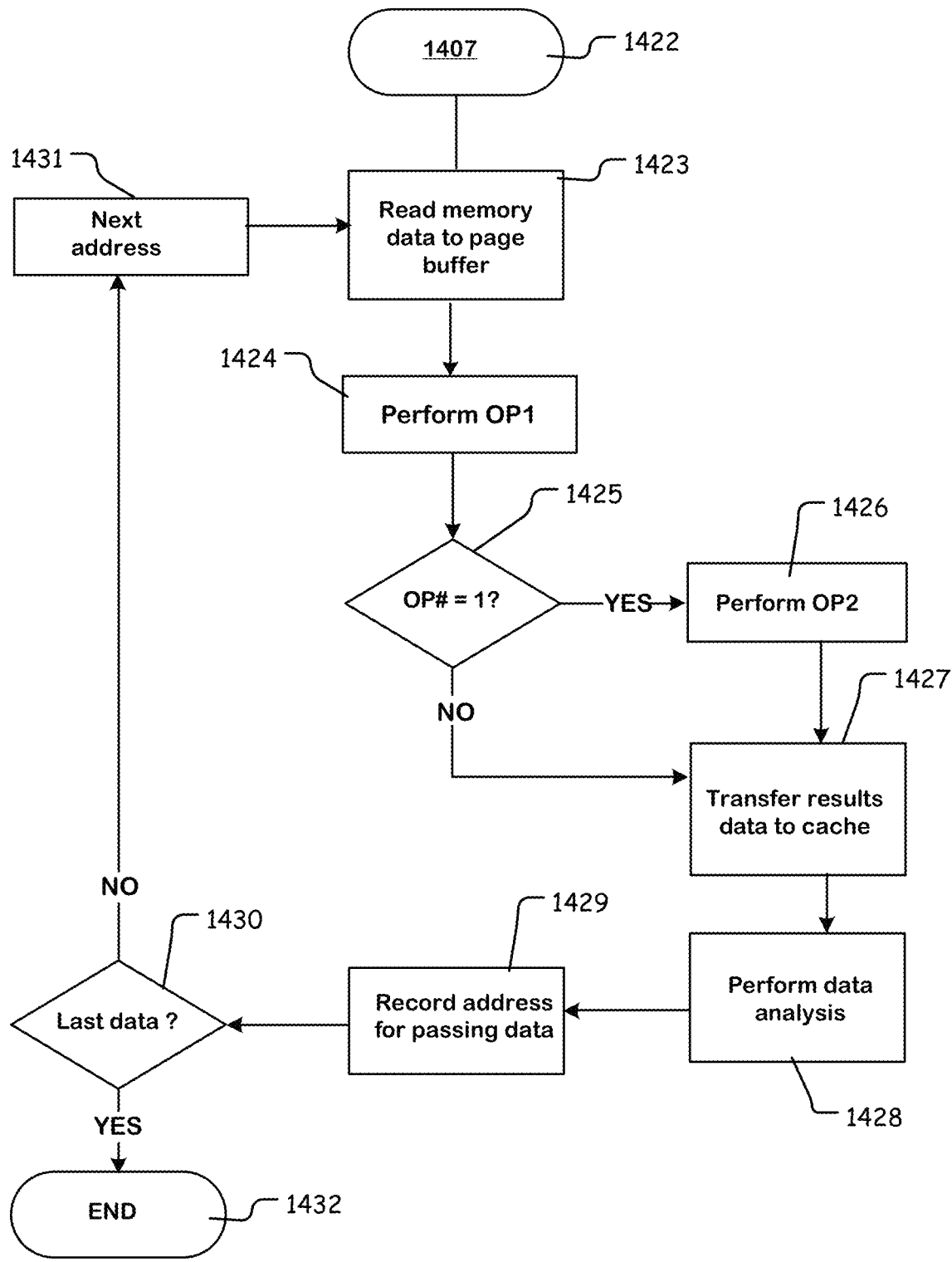

FIG. 14C is a flow chart of one example of a procedure represented by step 1407 of FIG. 14A which can be executed by state machine in response to decoding of a single external command using a command decoder on an integrated circuit memory for example, for a case on which the data analysis circuits are connected to the cache. The flowchart starts at step 1407 of FIG. 14A (1422). In response to the command including a starting address and an indication of a number of addresses such as an ending address or a sequence length parameter), memory data is read from the memory array into a line in the page buffer (1423). The opcode OP1 to be used for the first operation is applied, and logic circuits in the page buffer are used to perform OP1 over the read data and data in another line of the page buffer and store operation results to a line in the page buffer (1424). Then, it is determined whether a second opcode is to be executed in this example by looking at the parameter OP #(1425). The first and second opcode can identify the same logic function, such as illustrated in Table 1 above, or can identify different logic functions. If a second opcode is to be executed, then the second operation is performed (1426). If only one opcode is to be executed, or after the second opcode is executed at step 1426, then the results data is transferred to the cache (1427). Then a data analysis step is to be executed using the results data in the cache for the current data (1428). After the data analysis step, the address for passing data is written to a status control register (1429). Then the procedure determines whether a last page of data of the sequence has been analyzed (1430). If not, then a next address is generated (1431) and the data from the next address is read at step 1423, and the procedure continues until the last page. When last page is indicated at step 1430, then the procedure ends (1432).

A number of flowcharts illustrating logic executed by a memory host, a memory controller or by memory device or combinations of such devices, are described herein. With all flowcharts herein, it will be appreciated that many of the steps can be combined, performed in parallel or performed in a different sequence without affecting the functions achieved. In some cases, as the reader will appreciate, a re-arrangement of steps will achieve the same results only if certain other changes are made as well. In other cases, as the reader will appreciate, a re-arrangement of steps will achieve the same results only if certain conditions are satisfied. Furthermore, it will be appreciated that the flow charts herein show only steps that are pertinent to an understanding of the invention, and it will be understood that numerous additional steps for accomplishing other functions may be performed before, after and between those shown.

The present technology provides for efficient computation in memory which can be applied for low power settings. For example, in a common operation, the host may search the data stored in memory for some characteristic, such as a "proximity" scoring or indicating that at least a threshold number of bits (e.g., 95% or any other criterion) in a page read from memory, or results of logic functions over the page read from memory, match a page written to the page buffer from the host or read from another location in memory. Using the technology described herein, the host can execute the search or parts of the search without moving the data from the memory chip onto another chip, such as a controller chip, avoiding power consumption of the IO transition.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
a memory array, including a plurality of data lines for parallel access to memory array data;
an input/output interface;
a page buffer including:
data path circuits between the memory array and the input/output interface, the data path circuits including a plurality of buffer cells connected to respective data lines of the memory array, each buffer cell including a plurality of storage elements;
a plurality of computation circuits, the computation circuits connected to respective buffer cells in the plurality of buffer cells, to execute a function of data in the storage elements of the respective buffer cells, the plurality of computation circuits configured in parallel to generate a results data page including operation results for the plurality of buffer cells; and
a data analysis circuit connected to the data path circuits, to execute a function of the results data page to generate an analysis result.

2. The integrated circuit of claim 1, wherein the computation circuits store the operation results in the storage elements of the respective buffer cells.

3. The integrated circuit of claim 1, including a register to store the analysis result accessible via the input/output interface.

4. The integrated circuit of claim 1, wherein the plurality of computation circuits includes circuits to execute a group of functions, and are configurable in response to setup data, to select the function of data in the storage elements from the group of functions.

5. The integrated circuit of claim 1, wherein the function of the results data page includes counting of bits indicating a logic "1" or "0" in the results data page.

6. The integrated circuit of claim 5, wherein the function of the results data page includes a comparison of a resulting count to a threshold.

7. The integrated circuit of claim 5, wherein the results data page includes a plurality of segments, and the function of the results data page includes a comparison of resulting counts for each segment to a threshold.

8. The integrated circuit of claim 1, wherein the analysis circuit is configurable in response to setup data, to set the function of the results data page.

9. The integrated circuit of claim 1, including a command interface configured to execute a command to set the function of data in the storage elements of the respective buffer cells.

10. The integrated circuit of claim 1, wherein the plurality of computation circuits are configurable to execute more than one function of data in the storage elements of the respective buffer cells in sequence to produce the operation results for the plurality of buffer cells for the results data page.

11. The integrated circuit of claim 1, wherein the data path circuits include a cache, and circuits to transfer data from the plurality of buffer cells to storage elements in the cache, and to transfer data from the cache to the input/output interface.

12. The integrated circuit of claim 11, wherein the analysis circuit is configured to access the results data page in the cache.

13. The integrated circuit of claim 11, wherein the analysis circuit is configured to access the results data page in the storage elements in the plurality of buffer cells.

14. The integrated circuit of claim 1, wherein the data analysis circuit is configured as a failed bit detector in a program operation for the memory array.

15. The integrated circuit of claim 1, including a controller and a command decoder, the controller responsive to a command to set a logic operation, and to a command to adjust an analysis criterion.

16. The integrated circuit of claim 1, including a controller configured to execute a function to store data from the input/output interface in selected storage elements of the plurality of buffer cells.

17. The integrated circuit of claim 1, wherein the function of data in the storage elements of the plurality of buffer cells is a bit-by-bit logic operation on data in two or more storage elements of each buffer cell.

18. A method executed in an integrated circuit having a memory and a page buffer including a plurality of lines of storage elements, comprising:
storing first data in a first line in the page buffer as input to a computation;
storing second data in a second line in the page buffer as input to the computation; and
executing the computation, which is a compute-in-memory operation, in the page buffer to provide operation results.

19. The method of claim 18, including storing the operation results in one of the plurality of lines.

20. The method of claim 18, wherein said storing second data includes loading the second data in the second line from the memory.

21. The method of claim 18, including:
applying an analysis criterion to the operation results to generate an analysis result, and to store the analysis result in an accessible memory.

22. The method of claim 18, including:
transferring the operation results to a cache for data output.

23. The method of claim 18, including setting an operation type to select an operation for the computation in the page buffer.

24. The method of claim 18, including setting an operation type to select an operation for the computation in the page buffer by writing an operation identifier to a control register.

25. The method of claim 18, including:
  applying an analysis criterion to the operation results to generate an analysis result, and to store the analysis result in an accessible memory; and
  setting the analysis criterion for results of the computation.

26. The method of claim 25, including moving the operations results to a cache, and applying the analysis criterion to the operation results in the cache.

27. The method of claim 25, including applying the analysis criterion to the operation results in one of the lines of the page buffer.

28. An integrated circuit, comprising:
  a memory array, including a plurality of data lines for parallel access to memory array data;
  an input/output interface;
  data path circuits between the memory array and the input/output interface, the data path circuits including a plurality of buffer cells connected to respective data lines of the memory array, each buffer cell including a plurality of storage elements;
  a plurality of computation circuits, the computation circuits connected to respective buffer cells in the plurality of buffer cells, to execute a function of data in the storage elements of the respective buffer cells, the plurality of computation circuits configured in parallel to generate a results data page including operation results for the plurality of buffer cells;
  a data analysis circuit connected to the data path circuits, to execute a function of the results data page to generate an analysis result; and
  a setup register to store parameters of the function of data in the storage elements of the respective buffer cells, and of the function of the results data page.

* * * * *